(12) United States Patent
Lee

(10) Patent No.: US 11,532,595 B2
(45) Date of Patent: Dec. 20, 2022

(54) STACKED SEMICONDUCTOR DIES FOR SEMICONDUCTOR DEVICE ASSEMBLIES

(71) Applicant: Micron Technology, Inc., Boise, ID (US)

(72) Inventor: Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/190,324

(22) Filed: Mar. 2, 2021

(65) Prior Publication Data
US 2022/0285315 A1 Sep. 8, 2022

(51) Int. Cl.
*H01L 25/065* (2006.01)
*H01L 25/00* (2006.01)

(52) U.S. Cl.
CPC .......... *H01L 25/0652* (2013.01); *H01L 25/50* (2013.01); *H01L 2225/06506* (2013.01); *H01L 2225/06562* (2013.01); *H01L 2225/06586* (2013.01)

(58) Field of Classification Search
CPC ............ H01L 25/0652; H01L 25/50; H01L 2225/06506; H01L 2225/06562; H01L 2225/06586
See application file for complete search history.

(56) References Cited

U.S. PATENT DOCUMENTS

| | | |
|---|---|---|
| 2010/0090326 A1 | 4/2010 | Baek et al. |
| 2010/0255637 A1 | 10/2010 | Ishida et al. |
| 2019/0341366 A1 | 11/2019 | Chen et al. |
| 2020/0286860 A1 | 9/2020 | Lee |
| 2021/0050328 A1 | 2/2021 | Lee |
| 2022/0084977 A1* | 3/2022 | Fay .......... H01L 25/18 |

FOREIGN PATENT DOCUMENTS

| | | |
|---|---|---|
| TW | 201005898 A | 2/2010 |
| TW | 201115659 A | 5/2011 |

OTHER PUBLICATIONS

ROC (Taiwan) Patent Application No. 111106373—Taiwanese Office Action and Search Report, dated Aug. 19, 2022, with English Translation, 22 pages.

* cited by examiner

*Primary Examiner* — Thanh Y. Tran
(74) *Attorney, Agent, or Firm* — Perkins Coie LLP

(57) ABSTRACT

Stacked semiconductor dies for semiconductor device assemblies and associated methods and systems are disclosed. In some embodiments, the semiconductor die assembly includes a substrate with an opening extending therethrough. The assembly can include a stack of semiconductor dies attached to the substrate. The stack includes a first die attached to a front surface of the substrate, where the first die includes a first bond pad aligned with the opening. The stack also includes a second die attached to the first die such that an edge of the second die extends past a corresponding edge of the first die. The second die includes a second bond pad uncovered by the first die and aligned with the opening. A bond wire formed through the opening couples the first and second bond pads with a substrate bond pad on a back surface of the substrate.

20 Claims, 6 Drawing Sheets

STACKED SEMICONDUCTOR DIES FOR SEMICONDUCTOR DEVICE ASSEMBLIES

TECHNICAL FIELD

The present disclosure generally relates to semiconductor die assemblies, and more particularly relates to stacked semiconductor dies for semiconductor device assemblies and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

Market pressures continually drive semiconductor manufacturers to reduce the size of semiconductor die packages to fit within the space constraints of electronic devices, while also pressuring them to reduce cost associated with fabricating the packages. In some packages, two or more semiconductor dies are stacked on top of each other to reduce the footprint of the packages. In some cases, the semiconductors dies may include through-substrate vias (TSVs) to facilitate stacking of the semiconductor dies. Further, direct chip attach methods (e.g., flip-chip bonding between the semiconductor die and the substrate) may be used to reduce the height of the packages. Such techniques, however, tend to increase the cost for the manufacturers.

BRIEF DESCRIPTION OF THE DRAWINGS

Many aspects of the present technology can be better understood with reference to the following drawings. The components in the drawings are not necessarily to scale. Instead, emphasis is placed on illustrating clearly the overall features and the principles of the present technology.

DETAILED DESCRIPTION

Figure 1A:
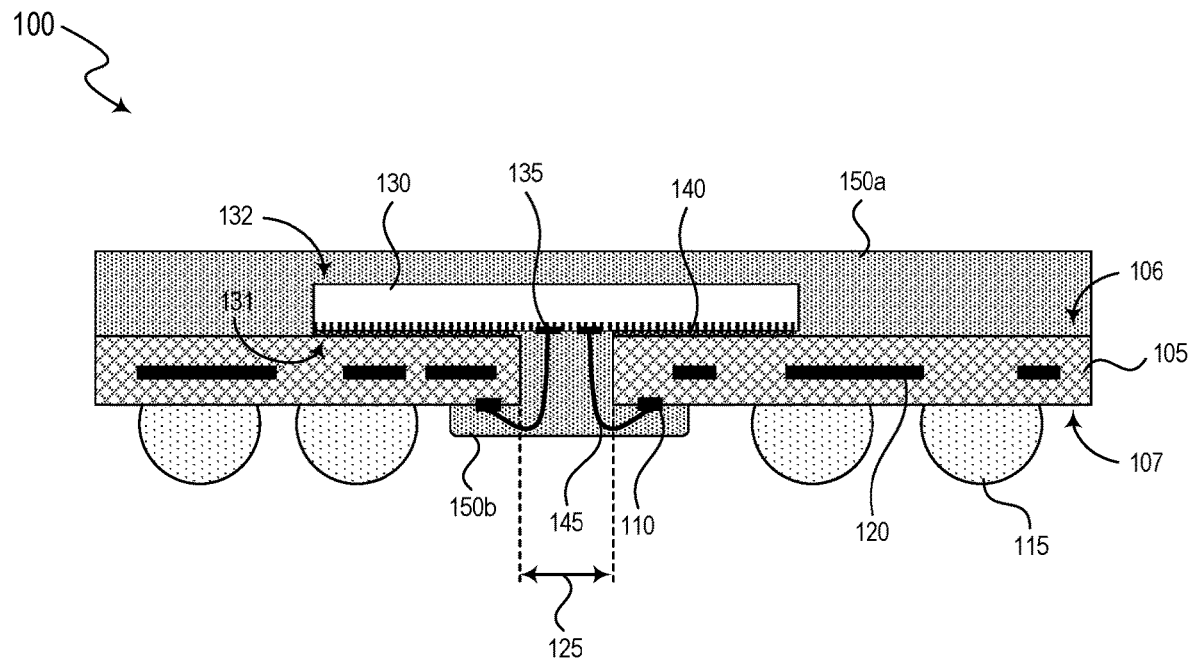
FIG. 1A is a cross-sectional diagram of a semiconductor die assembly.

Specific details of several embodiments of stacked semiconductor dies for semiconductor device assemblies, and associated systems and methods are described below. The term "semiconductor device or die" generally refers to a solid-state device that includes one or more semiconductor materials. Examples of semiconductor devices (or dies) include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates (e.g., silicon substrates). In certain semiconductor packages, a package substrate (which may also be referred to as a support substrate, a substrate, or the like) may carry one or more semiconductor dies. In some cases, the semiconductor dies may be structurally identical to each other (e.g., DRAM memory dies, NAND memory dies, etc.). In other cases, at least one semiconductor die may be a different kind from other semiconductor dies—e.g., a semiconductor package including a memory controller die and one or more memory dies.

Small form-factor packages present challenges for accommodating the stack of semiconductor dies (e.g., DRAM memory dies) on the package substrate. In some embodiments, the semiconductor dies may have TSVs that facilitates in-line stacking of the semiconductor dies to reduce the footprint of the stack. In some embodiments, a semiconductor die may be flipped (e.g., having its active surface with conductive pillars facing the package substrate) and directly connected to the package substrate (e.g., conductive pads of the substrate are electrically connected to the conductive pillars of the semiconductor die), which may be referred to as a flip-chip or a direct chip attachment (DCA) scheme. Process steps generating the conductive pillars (and other structures facilitating the conductive pillars to connect to bond pads of the semiconductor die) and connecting the conductive pillars to corresponding conductive pads of the substrate may be referred to a bumping process. Typically, the TSVs and/or DCA schemes tend to be costly—e.g., in view of various yield and/or reliability issues.

Aspects of the present technology facilitate providing lower cost alternatives to generate semiconductor die assemblies including stacks of semiconductor dies—e.g., without using the TSVs and/or the bumping process. Further, the present technology may reduce overall heights of the semiconductor die assemblies as the package substrate can include two or more stacks of semiconductor dies. As described in more detail herein, a package substrate may include an opening therethrough—e.g., the opening extending from a front surface to a back surface of the package substrate. The package substrate can carry two or more stacks of semiconductor dies on the front surface. Moreover, the package substrate includes substrate bond pads on the back surface, where terminals (e.g., solder balls) for the semiconductor die assemblies are disposed.

Figure 3A:
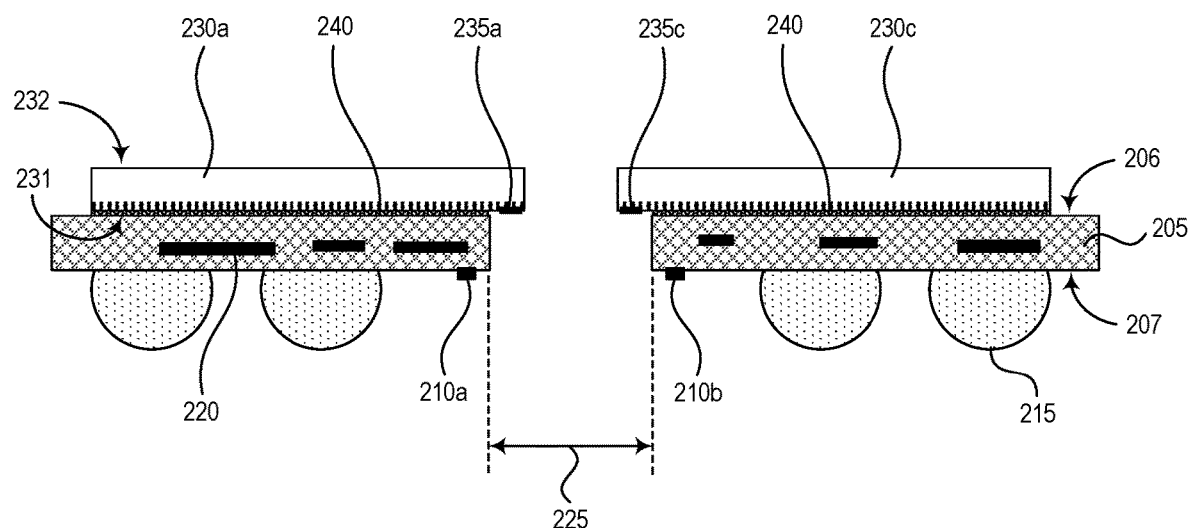
FIGS. 3A through 3D illustrate stages of a process for forming a semiconductor device assembly in accordance with embodiments of the present technology.
Figure 3B:
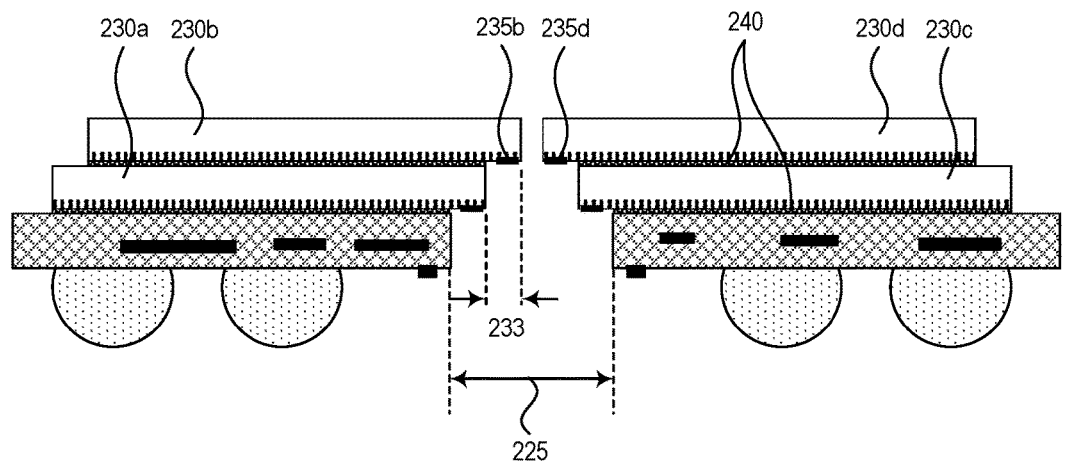
Figure 3C:
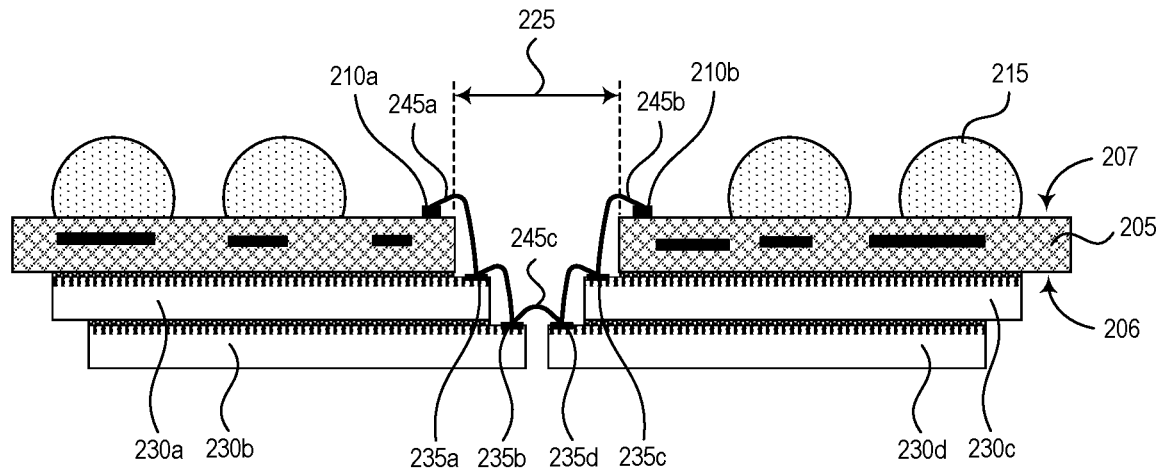

A first semiconductor die (a bottommost die of the stack of semiconductor dies) may be arranged to have its active side facing the front surface and attached to the package substrate using an adhesive layer (e.g., a die attach film (DAF)). The first semiconductor die may be designed to have its bond pads proximate to an edge of the die such that the bond pads can be aligned with the opening (e.g., exposed through the opening, accessible through the opening as illustrated in FIGS. 3A-3C) after attaching the first semiconductor die to the package substrate. Additionally, a second semiconductor die may be attached to the first semiconductor die (e.g., on a passive side of the first semiconductor die, opposite to the active side) using another adhesive layer such that its active side faces the front surface. The second semiconductor die is also designed to have its bond pads proximate to an edge of the die. When the second semiconductor die is attached to the first semiconductor die, the edge of the second semiconductor die can extend past a corresponding edge of the first semiconductor die such that the bond pads of the second semiconductor die are not covered by the first semiconductor die. Further, uncovered bond pads of the second die are aligned with the opening. In this manner, bond pads of the first and second semiconductor dies are exposed (e.g., available, accessible) for a subsequent wire bonding process that connects, using a bond wire, the bond pads of the first and second semiconductor dies to the substrate bond pads on the back surface of the package substrate.

In some embodiments, more than one stack of semiconductor dies may be formed on the package substrate in the manner described above. For example, a first stack of semiconductor dies may be formed in a first region of the front surface proximate to a first side of the opening, and a second stack of semiconductor dies may be formed in a second region of the front surface proximate to a second side of the opening opposite to the first side. Bond pads from the first and second stacks of semiconductor dies are aligned with the opening (e.g., the bond pads from the first and second stacks of semiconductor dies are located within the footprint of the opening) such that the wire bonding process can connect the bond pads of the first stack of semiconductor dies to first substrate bond pad(s) on the back surface, and connect the bond pads of the second stack of semiconductor dies to second substrate bond pad(s) on the back surface. Further, the wire bonding process can connect the bond pads of the first stack of semiconductor dies to the bond pads of the second stack of semiconductor dies, if desired.

In this manner, the package substrate can include two or more stacks of semiconductor dies to "spread out" the quantity of semiconductor dies across different regions of the package substrate such that the overall height of the semiconductor die assemblies can be reduced. Further, as the bond wires connect bond pads of the semiconductor dies to substrate bond pads on the back surface where the terminals (e.g., solder balls) are disposed, "looping" portions of the bond wires can be managed to be less than the height of the solder balls. Accordingly, the "looping" portions of the bond wires do not add to the height of the semiconductor die assemblies. The wire bonding process can also avoid risks associated complicated and/or costly techniques (e.g., forming TSVs, the bumping process, or the like).

As used herein, the terms "front," "back," "vertical," "lateral," "down," "up," "upper," "lower," "bottom," and "top" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1A is a cross-sectional diagram of a semiconductor die assembly 100 ("assembly 100"). The assembly 100 includes a package substrate 105 and a semiconductor die 130 attached to a front surface 106 of the substrate 105—e.g., through an adhesive layer 140. Further, the assembly 100 includes bond wires 145 formed through an opening 125 of the package substrate 105 to couple individual bond pads 135 of the semiconductor die 130 to corresponding one of substrate bond pads 110 of the package substrate 105. The assembly 100 also includes moldings 150 (e.g., the molding 150a on the front surface 106 of the substrate 105 encapsulating the semiconductor die 130, the molding 150b on a back surface 107 of the substrate 105 encapsulating the opening 125 and the bond wires 145), as well as terminals 115 (e.g., solder balls).

The substrate 105 has the front surface 106 (or front side) and the back surface 107 (or back side) opposite to the front surface 106. Also, the package substrate 105 includes various conductive structures, such as substrate bond pads 110 on the back surface 107 and interconnects 120 (e.g., metallic traces and/or wires, or the like) configured to route electrical signals between the substrate bond pads 110 and the terminals 115. The terminals 115 may couple the assembly 100 to other components. For example, the assembly 100 may be mounted on a printed circuit board through the terminals 115, on which the other components are mounted.

The semiconductor die 130 includes a first side 131 and a second side 132 opposite to the first side 131. The first side 131 of the semiconductor die 130 includes various conductive structures, such as bond pads 135, redistribution features (e.g., interconnects, metallic traces configured to route electrical signals), or the like. Further, the semiconductor die 130 may include various functional features (e.g., integrated circuits and/or active components) proximate to the first side 131, some of which are coupled to the bond pads 135 (e.g., through the redistribution features). As such, the first side 131 may be referred to as an active side of the semiconductor die 130, and the second side 132 may be referred to as a passive side of the semiconductor die 130. As illustrated in FIG. 1A, the semiconductor die 130 is arranged to have the active side 131 facing the front surface 106 of the substrate 105. Further, the bond pads 135 are positioned near the middle of the semiconductor die 130 such that the bond pads 135 can be aligned with the opening 125 after the semiconductor die 130 has been attached to the substrate 105.

Figure 1B:
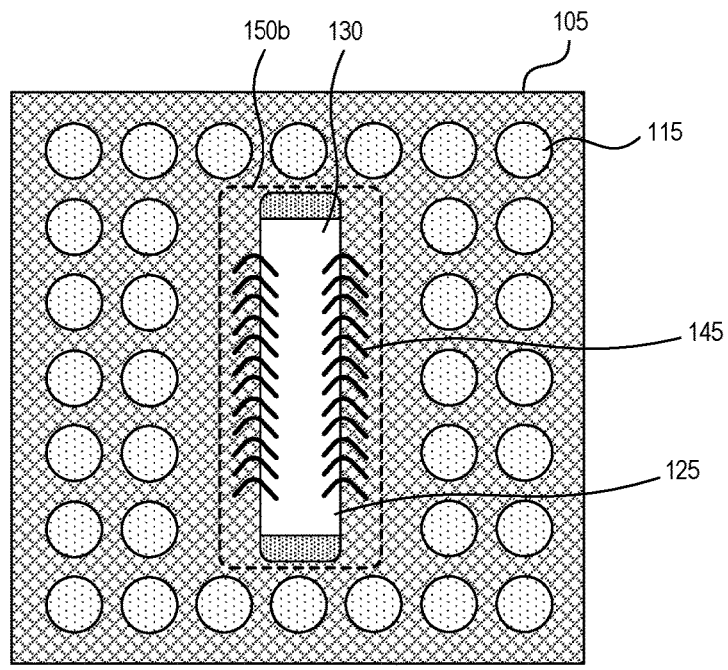
FIG. 1B is a plan view of the semiconductor die assembly.

FIG. 1B is a plan view of the semiconductor die assembly 100 showing the back surface 107 of the substrate 105. FIG. 1B depicts the opening 125 and the bond wires 145 coupling the bond pads 135 (not shown) of the semiconductor die 130 and the substrate bond pads 110 (not shown) through the opening 125. Further, the footprint of the molding 150b that encapsulates the opening 125 and the bond wires 145 is shown as a broken line.

Figure 2A:
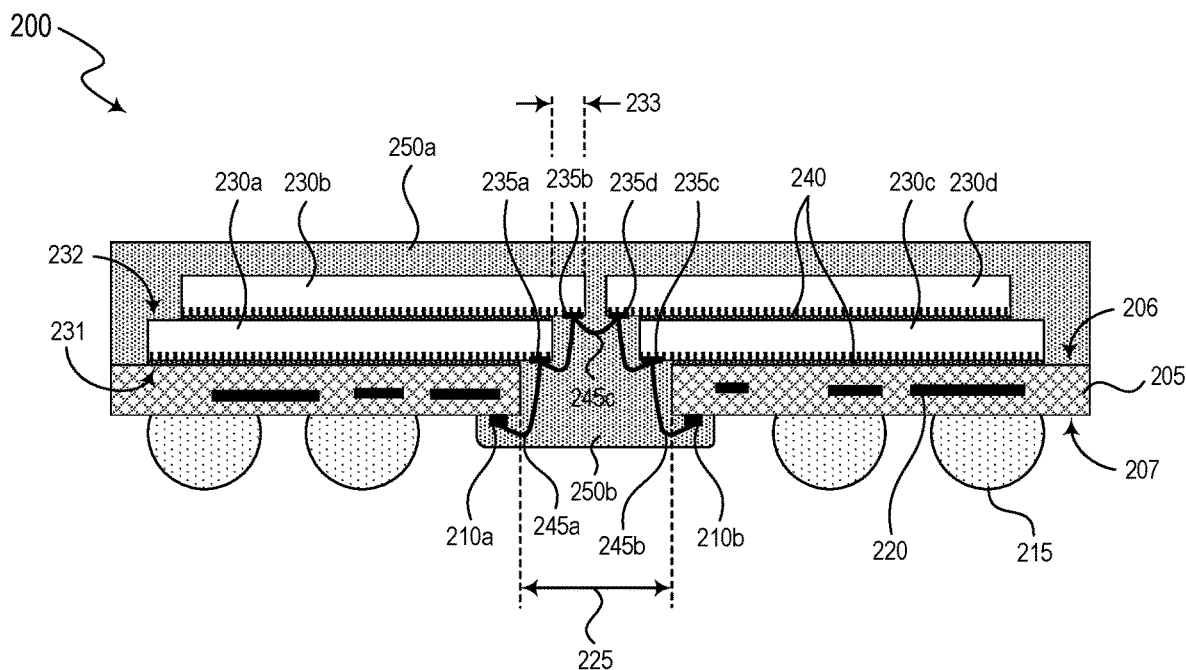
FIG. 2A is a cross-sectional diagram of a semiconductor die assembly configured in accordance with embodiments of the present technology.

FIG. 2A is a cross-sectional diagram of a semiconductor die assembly 200 ("assembly 200") configured in accordance with embodiments of the present technology. The assembly 200 includes a package substrate 205 (or substrate 205), four (4) semiconductor dies 230 (also identified individually as 230a-d) carried by the substrate 205. The semiconductor dies 230a and 230b are stacked such that the semiconductor die 230a is attached to a front surface 206 of the substrate 205 (through an adhesive layer 240) and the semiconductor die 230b is attached to the semiconductor die 230a (through another adhesive layer 240). Similarly, the semiconductor dies 230c and 230d are stacked and attached to the substrate 205. Further, the assembly 200 includes bond wires 245 (also identified individually as 245a-c) formed through an opening 225 of the package substrate 205 to couple bond pads 235 (also identified individually as 235a-d) of the semiconductor dies 230 to corresponding one of substrate bond pads 210 (also identified individually as 210a/b) of the package substrate 205. As shown in FIG. 2A, the opening 225 extends through the substrate 205. The assembly 200 also includes moldings 250 (e.g., the molding 250a on the front surface 206 of the substrate 205 encapsulating the semiconductor dies 230, the molding 250b on the back surface 207 of the substrate 205 encapsulating the opening 225 and the bond wires 245), as well as terminals 215 (e.g., solder balls).

The package substrate 205 (or substrate) may be an example of or include aspects of the substrate 105. For example, the substrate 205 has the front surface 206 (or front side) and the back surface 207 (or back side) opposite to the front surface 206. The opening 225 included in the package substrate 205 extends from the front surface 206 to the back surface 207. Also, the package substrate 205 includes various conductive structures, such as substrate bond pads 210 on the back surface 207 and interconnects 220 (e.g., metallic traces and/or wires, or the like) configured to route electrical signals between the substrate bond pads 210 and the terminals 215. The terminals 215 may couple the assembly 200 to other components.

The semiconductor dies 230 may include aspects of the semiconductor die 130. For example, semiconductor dies 230 include a first side 231 and a second side 232 opposite to the first side 231. The first side 231 of the semiconductor dies 230 includes various conductive structures, such as bond pads 235, redistribution features (e.g., interconnects, metallic traces configured to route electrical signals), or the like. Further, the semiconductor dies 230 may include various functional features (e.g., integrated circuits and/or active components) proximate to the first side 231, some of which are coupled to the bond pads 235 (e.g., through the redistribution features). As such, the first side 231 may be referred to as an active side of the semiconductor dies 230, and the second side 232 may be referred to as a passive side of the semiconductor dies 230. In some embodiments, the semiconductor dies 230a-d are semiconductor memory dies (e.g., DRAM memory dies, NAND memory dies).

As illustrated in FIG. 2A, the assembly 200 includes the semiconductor die 230a attached to the front surface 206—e.g., through the adhesive layer 240. The semiconductor die 230a is arranged to have its active side 231 facing the front surface 206. Moreover, the semiconductor die 230a may be designed to have its bond pads proximate to an edge of the die (e.g., the edge extending past the opening 225) such that the bond pads can be aligned with the opening 225 (e.g., exposed and/or accessible through the opening 225 during a wire bonding process) after being attached to the package substrate 205. As such, the semiconductor die 230a has the bond pad 235a aligned with the opening 225 after being attached to the front surface 206.

Also, the assembly 200 includes the semiconductor die 230b attached to the semiconductor die 230a such that an edge of the semiconductor die 230b extends past a corresponding edge of the semiconductor die 230a. Accordingly, the semiconductor die 230b has an extended portion 233 uncovered by the semiconductor die 230a. The semiconductor die 230b also has its bond pads proximate to an edge of the die (e.g., the edge extending past the opening 225 and the semiconductor die 230a) such that the bond pads (e.g., the bond pad 235b) are uncovered by the semiconductor die 230a and aligned with the opening 225 (e.g., exposed and/or accessible through the opening 225 during the wire bonding process) after being attached to the semiconductor die 230a. In other words, the semiconductor die 230b may have its bond pads in the extended portion 233. Additionally, the semiconductor die 230b has its active side facing the front surface 206.

The assembly 200 as depicted in FIG. 2A further includes the semiconductor die 230c attached to the front surface 206 and the semiconductor die 230d attached to the passive side 232 of the semiconductor die 230c, thereby forming a stack of semiconductor dies. As described above, the semiconductor dies 230c and 230d may have their bond pads 235c and 235d aligned with the opening 225 after being attached to the front surface 206. Further, the assembly 200 includes bond wires 245 (e.g., bond wires 245a-c forming a single bond wire as depicted in FIG. 2A) connecting the substrate bond pad 210a, the bond pads 235a through 235d, and the substrate bond pad 210b. In some embodiments, the substrate bond pads 210a/b provide a signal (e.g., voltage) common to all the semiconductor dies 230—e.g., a ground, a voltage supply, an external clock signal, etc. In such embodiments, having the signal supplied from both substrate bond pads 210a/b may be beneficial—e.g., to mitigate issues associated with delays in the signal propagation. Although FIG. 2A depicts a particular arrangement of bond wires 245 (e.g., providing the common signal), the present technology is not limited thereto.

In some embodiments, a certain portion of the single bond wire (e.g., the bond wires 245a-c) depicted in FIG. 2A may be omitted. For example, a portion of 245b (e.g., the portion coupling the bond pad 235c with the substrate bond pad 210b) may be omitted. In other examples, a portion of 245a (e.g., the portion coupling the bond pad 235a with the substrate bond pad 210a) may be omitted. In some embodiments, the bond wire 245c (coupling the bond pad 235b with the bond pad 235d) may be omitted. As such, the assembly 200 may include the bond wire 245a coupling the bond pads 235a and 235b with the substrate bond pad 210a on the back surface 207 of the substrate 205 through the opening 225. Additionally, or alternatively, the assembly 200 may include the bond wire 245b coupling the bond pads 235c and 235d with the substrate bond pad 210b on the back surface 207 of the substrate 205 through the opening 225.

The bond wire 245c may be regarded as coupling a first bond pad (e.g., the bond pad 235b) of a first semiconductor die (e.g., the semiconductor die 230b) with a second bond pad (e.g., the bond pad 235d) of a second semiconductor die (e.g., the semiconductor die 230d), where the first and second dies are not stacked together. Such bond wires (e.g., the bond wire 245c) may facilitate forming bond wires between adjacent stacks of semiconductor dies. Further, although FIG. 2A illustrates the bond wire 245c coupling bond pads facing toward the front surface 206 of the substrate 205, in other embodiments, such bond wires can couple bond pads facing away the front surface 206 of the substrate 205—e.g., a first and second semiconductor dies, each attached to the front surface 206 with their passive sides facing the front surface 206.

Moreover, the assembly 200 includes a first molding 250a on the front surface 206 of the substrate 205, where the first molding 250a encapsulates the semiconductor dies 230. Also, the assembly 200 includes a second molding 250b on the back surface 207 of the substrate 205, where the second molding 250b covers and extends into the opening 225. The second molding 250b also encapsulates the bond wires 245.

Figure 2B:
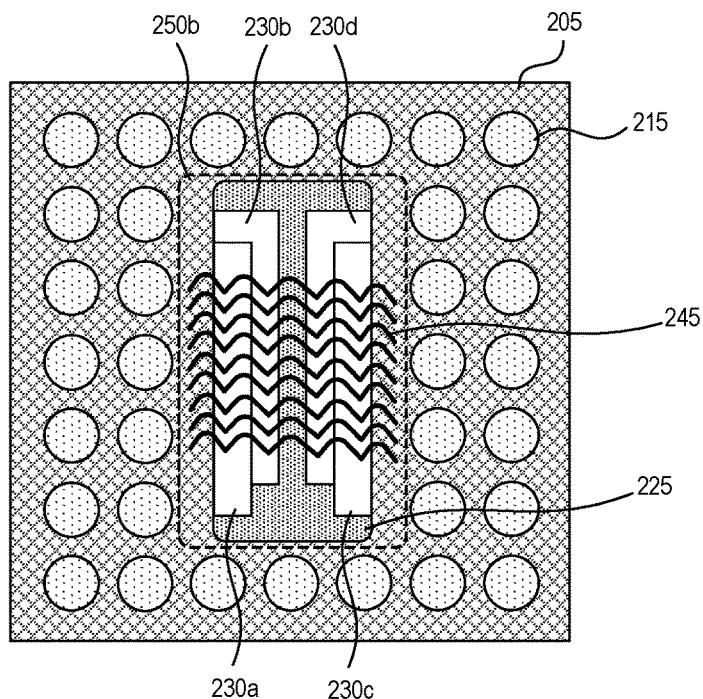
FIG. 2B is a plan view of the semiconductor die assembly.

FIG. 2B is a plan view of the semiconductor die assembly 200 showing the back surface 207 of the substrate 205. FIG. 2B depicts the opening 225 and the bond wires 245 coupling the bond pads 235 (not shown) of the semiconductor dies 230 (also identified individually as semiconductor dies 230a-d) and the substrate bond pads 210 (not shown) through the opening 225. Further, the footprint of the molding 250b that encapsulates the opening 225 and the bond wires 245 is shown as a broken line. As shown in FIG. 2B, the second semiconductor die 230b (and/or the fourth semiconductor die 230d) may have two edges extending past (e.g., offset) corresponding edges of the first semiconductor die 230a (and/or the third semiconductor die 230d) to form the shingled stack(s) of memory dies.

Although the example assembly 200 of FIG. 2A includes two (2) stacks of semiconductor dies that the substrate 205 carries, the present technology is not limited thereto. In some embodiments, the assembly includes one stack of semiconductor dies that the substrate 205 carries. In other embodiments, the assembly includes more than two (2) stacks of semiconductor dies that the substrate 205 carries. For example, a first stack of semiconductor dies may be located in a first region of the front surface 206 of the substrate 205 proximate to a first side of the opening 225. Further, a second stack of semiconductor dies may be located in a second region of the front surface 206 of the substrate 205 proximate to a second side of the opening 225, where the second side is opposite to the first side. Additionally, a third stack of semiconductor dies (or a third semiconductor die) may be located in a third region of the front surface 206 of the substrate 205 proximate to a third side of the opening 225, where the third side is generally perpendicular to the first and/or second sides of the opening 225.

Moreover, although the example assembly 200 of FIG. 2A includes two (2) stacks of semiconductor dies that each includes two semiconductor dies, the present technology is not limited thereto. For example, the assembly may include two semiconductor dies (e.g., the semiconductor die 230a and the semiconductor die 230c) attached to the substrate 205. In another example, the two stacks of semiconductor dies may include different quantities of semiconductor dies—e.g., two (2) semiconductor dies in a first stack and one (1) or three (3) semiconductor dies in a second stack, or the like.

In some embodiments, a semiconductor package comprises a package substrate including a front surface and a back surface opposite to the front surface, where the package substrate includes an opening extending through the package substrate. Further, the semiconductor package comprises two or more stacks of memory dies attached to the front surface, where each stack of memory dies includes a first memory die attached to the front surface, where the first memory die includes an active side facing the front surface and a passive side opposite to the active side, the active side of the first memory die having a first bond pad aligned with the opening, and a second memory die attached to the passive side of the first memory die such that an edge of the second memory die extends past a corresponding edge of the first memory die, where the second memory die includes an active side facing the front surface and having a second bond pad uncovered by the first memory die and aligned with the opening. The semiconductor package further comprises two or more bond wires through the opening, where each bond wire couples the first and second bond pads of a corresponding stack of memory dies with a corresponding substrate bond pad on the back surface of the package substrate.

In some embodiments, at least two second bond pads that each is included in a corresponding stack of the two or more stacks of memory dies, are coupled to each other through a second bond wire. In some embodiments, the semiconductor package further comprises a first molding on the front surface of the package substrate, the first molding encapsulating the two or more stacks of memory dies, and a second molding on the back surface of the package substrate, the second molding extending into the opening and encapsulating the two or more bond wires.

FIGS. 3A through 3D illustrate stages of a process for forming a semiconductor device assembly (e.g., the semiconductor device assembly 200) in accordance with embodiments of the present technology. FIG. 3A illustrates the assembly 200 after the opening 225 is formed in the substrate 205 and the semiconductor die 230a (and the semiconductor die 230c, in some cases) is attached to the front surface 206 using the adhesive layer 240. The opening 225 extends from the front surface 206 to the back surface 207. The semiconductor die 230a includes the active side 231 facing the front surface 206 and the bond pad 235a aligned with the opening 225. Similarly, the semiconductor die 230c has its active side 231 facing the front surface 206 and the bond pad 235c aligned with the opening 225.

FIG. 3B illustrates the assembly 200 after the semiconductor die 230b (and the semiconductor die 230d, in some cases) is attached to the semiconductor die 230a (and to the semiconductor die 230c)—e.g., using another adhesive layer 240. An edge of the semiconductor die 230b extends past a corresponding edge of the semiconductor die 230a such that the semiconductor die 230b has an extended portion 233 uncovered by the semiconductor die 230a. The semiconductor die 230b has its active side 231 facing the front surface 206 and the bond pad 235b uncovered by the semiconductor die 230a and aligned with the opening 225. Similarly, the semiconductor die 230d has its active side facing the front surface 206 and the bond pad 235d uncovered by the semiconductor die 230c and aligned with the opening 225.

FIG. 3C illustrates the assembly 200 having been flipped (e.g., with respect to the assembly 200 depicted in FIG. 3B). Bond pads 235a through 235d are exposed (accessible) through the opening 225. Subsequently, the bond wires 245 are formed through the opening 225 to couple the substrate bond pads 210a/b with the bond pads 235a-d. As described with reference to FIG. 3C, various configurations of the bond wires 245 are within the scope of the present technology.

Figure 3D:
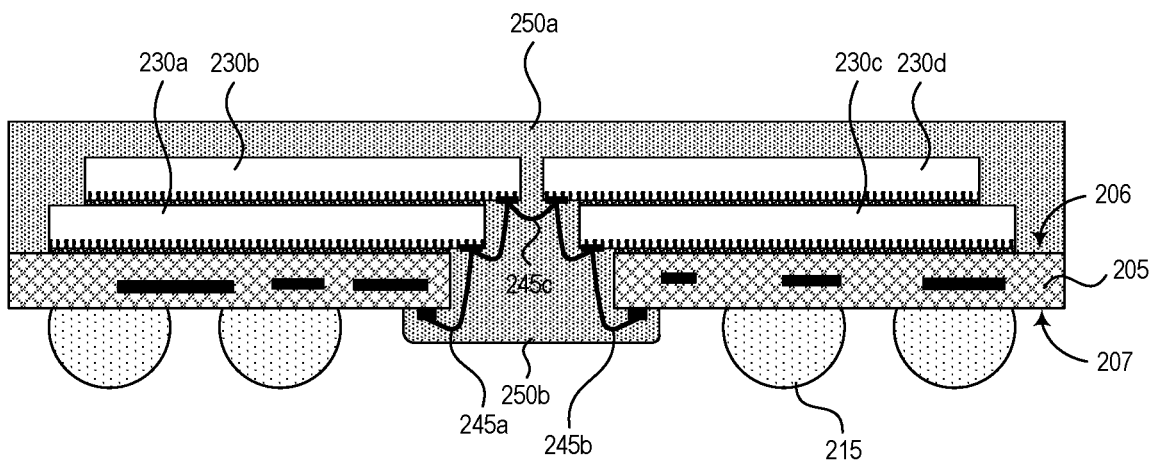

FIG. 3D illustrates the assembly 200 having been flipped (e.g., with respect to the assembly 200 depicted in FIG. 3C). Further, the molding 250a may be formed on the front surface 206 of the substrate 205, where the molding 250a encapsulates the semiconductor dies 230a-d. Moreover, the molding 250b may be formed on the back surface 207 of the substrate 205 such that the molding 250b covers and extends into the opening 225 to encapsulate the bond wires 245a-c.

Although FIGS. 3A through 3D illustrate a particular sequence of stacking individual semiconductor dies (e.g., attaching the semiconductor dies 230a/c to the package substrate 205, then attaching the semiconductor dies 230b/d to the semiconductor dies 230a/c, respectively), the present technology is not limited thereto. For example, the semiconductor die 230a may be attached to the package substrate 205, and then the semiconductor dies 230b may be attached to the semiconductor dies 230a. Thereafter, the semiconductor die 230c may be attached to the package substrate 205, and then the semiconductor dies 230d may be attached to the semiconductor dies 230c. In other examples, a first stack of the semiconductor die 230a/b may be formed, and then the first stack may be attached to the package substrate 205. Subsequently, a second stack of the semiconductor die 230c/d may be formed, and then the second stack may be attached to the package substrate 205.

Figure 4:
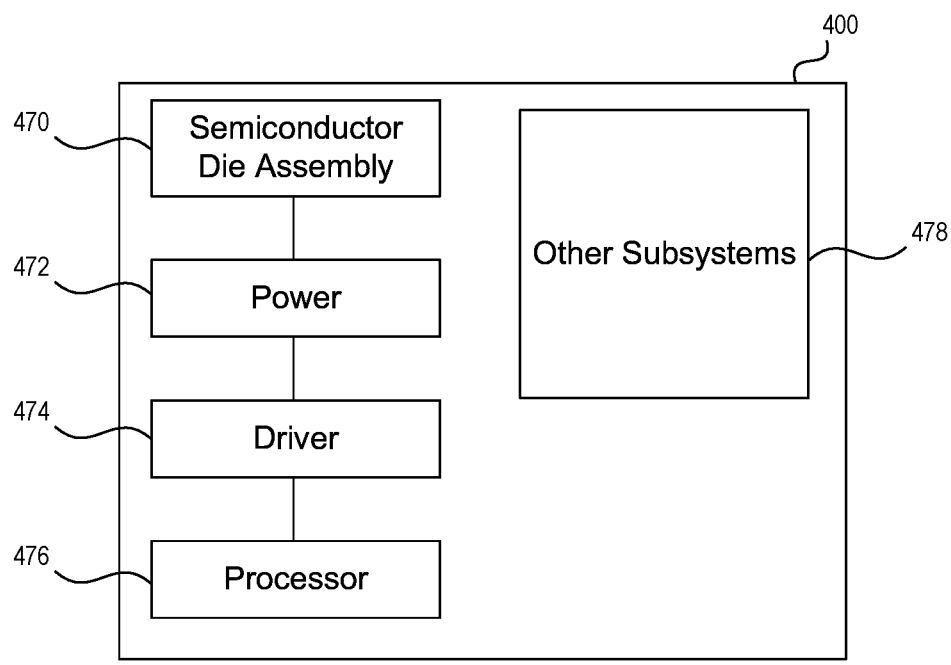
FIG. 4 is a block diagram schematically illustrating a system including a semiconductor die assembly configured in accordance with embodiments of the present technology.

The semiconductor die assembly (e.g., the semiconductor die assemblies 200) described above with reference to FIGS. 2A through 3D can be incorporated into any of a myriad of larger and/or more complex systems, a representative example of which is a system 400 shown schematically in FIG. 4. The system 400 can include a semiconductor die assembly 470, a power source 472, a driver 474, a processor 476, and/or other subsystems or components 478. The semiconductor die assembly 470 can include features generally similar to those of the semiconductor die assemblies described above and can therefore include a substrate with an opening therethrough. The substrate has a front surface and a back surface opposite to the front surface. Further, the semiconductor die assembly 470 can include one or more stacks of semiconductor dies attached to the front surface. Each stack of semiconductor dies may include a first die attached to the front surface, where the first die includes an active side facing the front surface and a passive side opposite to the active side, the active side of the first die having a first bond pad aligned with the opening, and a second die attached to the passive side of the first die such that an edge of the second die extends past a corresponding edge of the first die, where the second die includes an active side facing the front surface and having a second bond pad uncovered by the first die and aligned with the opening. The semiconductor die assembly 470 also includes one or more bond wires through the opening, where each bond wire couples the first and second bond pads of a corresponding stack of semiconductor dies with a corresponding substrate bond pad on the back surface of the substrate.

The resulting system 400 can perform any of a wide variety of functions, such as memory storage, data processing, and/or other suitable functions. Accordingly, representative systems 400 can include, without limitation, handheld devices (e.g., mobile phones, tablets, digital readers, and digital audio players), computers, and appliances. Components of the system 400 may be housed in a single unit or distributed over multiple, interconnected units (e.g., through a communications network). The components of the system 400 can also include remote devices and any of a wide variety of computer readable media.

Figure 5:
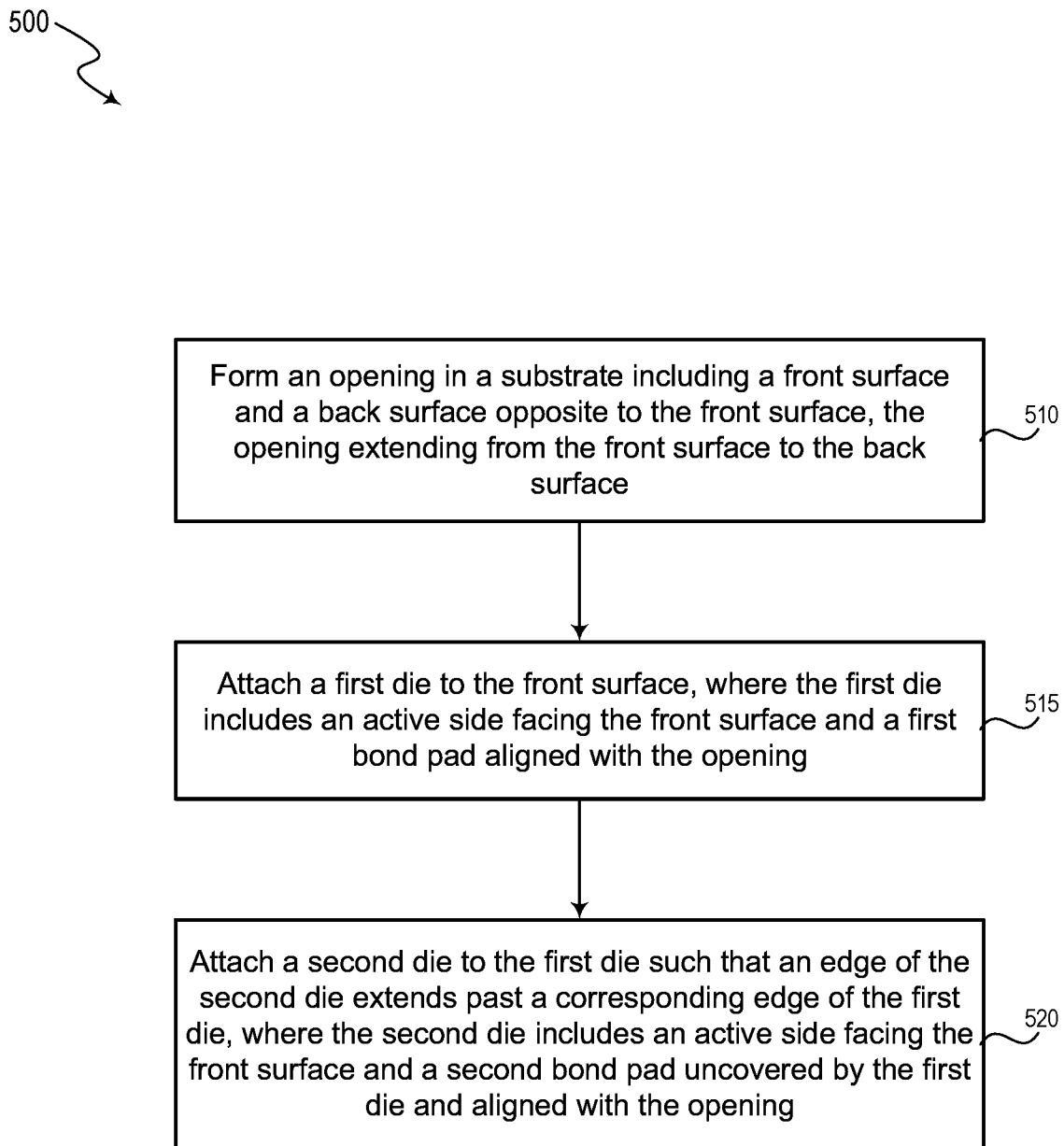
FIG. 5 is a flowchart of a method of forming a semiconductor die assembly configured in accordance with embodiments of the present technology.

FIG. 5 is a flowchart 500 illustrating a method of forming a semiconductor die assembly configured in accordance with embodiments of the present technology. The method includes forming an opening in a substrate including a front surface and a back surface opposite to the front surface, the opening extending from the front surface to the back surface (box 510). The method further includes attaching a first die to the front surface, wherein the first die includes an active side facing the front surface and a first bond pad aligned with the opening (box 515). The method further includes attaching a second die to the first die such that an edge of the second die extends past a corresponding edge of the first die, wherein the second die includes an active side facing the front surface and a second bond pad uncovered by the first die and aligned with the opening (box 520).

In some embodiments, the method may further include forming a first bond wire through the opening, the first bond wire coupling the first and second bond pads with a first substrate bond pad on the back surface of the substrate. In some embodiments, the method may further include attaching a third die to the front surface, wherein the third die includes an active side facing the front surface and a third bond pad aligned with the opening, and attaching a fourth die to the third die such that an edge of the fourth die extends past a corresponding edge of the third die, wherein the fourth die includes an active side facing the front surface and a fourth bond pad uncovered by the third die and aligned with the opening.

In some embodiments, the method may further include forming a bond wire through the opening, the bond wire configured to connect a first substrate bond pad on the back surface of the substrate, the first, second, third, and fourth bond pads, and a second substrate bond pad on the back surface of the substrate in series. In some embodiments, the method may further include forming a first bond wire through the opening, the first bond wire coupling the first and second bond pads with a first substrate bond pad on the back surface of the substrate, and forming a second bond wire through the opening, the second bond wire coupling the third and fourth bond pads with a second substrate bond pad on the back surface of the substrate.

In some embodiments, the method may further include forming a third bond wire coupling the second bond pad of the second die with the fourth bond pad of the fourth die. In some embodiments, the method may further include forming a first molding on the front surface of the substrate, the first molding encapsulating the first, second, third, and fourth dies, and forming a second molding on the back surface of the substrate, the second molding extending into the opening and encapsulating the first, second, and third bond wires.

From the foregoing, it will be appreciated that specific embodiments of the technology have been described herein for purposes of illustration, but that various modifications may be made without deviating from the disclosure. For example, although the embodiments of the semiconductor die assemblies are described with four (4) semiconductor dies, in other embodiments, the semiconductor die assemblies can be configured to have a different quantity (e.g., two, three, five, six, eight, even more) of semiconductor dies.

Further, although in the foregoing example embodiment, the substrate with one opening has been described and illustrated, in other embodiments, the substrate may be provided with two or more such openings. In addition, the openings may be formed anywhere (e.g., not limited to central, inner and/or outer portions) in the substrate to provide accesses to the bond pads of the semiconductor dies such that bonding wires can be formed to couple the bond pads of the semiconductor dies to corresponding substrate bond pads of the substrate through the openings. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device (or die), may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a substrate including a front surface and a back surface opposite to the front surface, wherein the substrate includes an opening completely surrounded by a peripheral region of the substrate and extending from the front surface to the back surface;
   a first die attached to the front surface, wherein the first die includes an active side facing the front surface and having a first bond pad aligned with the opening;
   a second die attached to the first die such that an edge of the second die extends past a corresponding edge of the first die, wherein the second die includes an active side facing the front surface and having a second bond pad uncovered by the first die and aligned with the opening; and
   a first bond wire coupling the first and second bond pads with a first substrate bond pad on the back surface of the substrate through the opening.

2. The semiconductor die assembly of claim 1, further comprising:
   a third die attached to the front surface of the substrate, wherein the third die includes an active side facing the front surface and having a third bond pad aligned with the opening;
   a fourth die attached to the third die such that an edge of the fourth die extends past a corresponding edge of the third die, wherein the fourth die includes an active side facing the front surface and having a fourth bond pad uncovered by the third die and aligned with the opening; and
   a second bond wire coupling the third and fourth bond pads with a second substrate bond pad on the back surface of the substrate through the opening.

3. The semiconductor die assembly of claim 2, further comprising:
   a third bond wire coupling the second bond pad of the second die with the fourth bond pad of the fourth die.

4. The semiconductor die assembly of claim 3, wherein a single bond wire includes the first, second, and third bond wires.

5. The semiconductor die assembly of claim 3, wherein the first, second, third, and fourth dies are semiconductor memory dies.

6. The semiconductor die assembly of claim 2, wherein:
   the first and second dies are located in a first region of the front surface of the substrate proximate to a first side of the opening, wherein the first and second dies are stacked;
   the third and fourth dies are located in a second region of the front surface of the substrate proximate to a second side of the opening, the second side opposite to the first side, wherein the third and fourth dies are stacked.

7. The semiconductor die assembly of claim 6, further comprising:
   a fifth die attached to the front surface of the substrate, wherein the fifth die includes an active side facing the front surface and having a fifth bond pad aligned with the opening;
   a third bond wire coupling the fifth bond pad with a third substrate bond pad on the back surface of the substrate through the opening; and
   the fifth die is located in a third region of the front surface proximate to a third side of the opening, the third side being generally perpendicular to the first and/or second sides.

8. The semiconductor die assembly of claim 1, further comprising:
   a first molding on the front surface of the substrate, the first molding encapsulating the first and second dies; and
   a second molding on the back surface of the substrate, the second molding extending into the opening and encapsulating the first bond wire.

9. The semiconductor die assembly of claim 1, further comprising:
   a third die attached to the front surface of the substrate, wherein the third die includes an active side facing the front surface and having a third bond pad aligned with the opening, and wherein the first bond wire further couples the third bond pad of the third die with the second bond pad of the second die.

10. The semiconductor die assembly of claim 1, further comprising:
    a third die attached to the front surface of the substrate, wherein the third die includes an active side facing the front surface and having a third bond pad aligned with the opening; and
    a fourth die attached to the third die such that an edge of the fourth die extends past a corresponding edge of the third die, wherein the fourth die includes an active side facing the front surface and having a fourth bond pad uncovered by the third die and aligned with the opening, and wherein the first bond wire further couples the third and fourth bond pads with the second bond pad of the second die.

11. A semiconductor package, comprising:
    a package substrate including a front surface and a back surface opposite to the front surface, wherein the package substrate includes an opening completely surrounded by a peripheral region of the substrate and extending through the package substrate;
    two or more stacks of memory dies attached to the front surface, wherein each stack of memory dies includes:
    a first memory die attached to the front surface, wherein the first memory die includes an active side facing the front surface and a passive side opposite to the active side, the active side of the first memory die having a first bond pad aligned with the opening; and a second memory die attached to the passive side of the first memory die such that an edge of the second memory die extends past a corresponding edge of the first memory die, wherein the second memory die includes an active side facing the front surface and having a second bond pad uncovered by the first memory die and aligned with the opening; and two or more bond wires through the opening, wherein each bond wire couples the first and second bond pads of a corresponding stack of memory dies with a corresponding substrate bond pad on the back surface of the package substrate.

12. The semiconductor package of claim 11, wherein:
at least two second bond pads that each is included in a corresponding stack of the two or more stacks of memory dies, are coupled to each other through a second bond wire.

13. The semiconductor package of claim 11, further comprising:
a first molding on the front surface of the package substrate, the first molding encapsulating the two or more stacks of memory dies; and a second molding on the back surface of the package substrate, the second molding extending into the opening and encapsulating the two or more bond wires.

14. A method, comprising:
forming an opening in a substrate including a front surface and a back surface opposite to the front surface, the opening completely surrounded by a peripheral region of the substrate and extending from the front surface to the back surface;

attaching a first die to the front surface, wherein the first die includes an active side facing the front surface and a first bond pad aligned with the opening; and attaching a second die to the first die such that an edge of the second die extends past a corresponding edge of the first die, wherein the second die includes an active side facing the front surface and a second bond pad uncovered by the first die and aligned with the opening.

15. The method of claim 14, further comprising:
forming a first bond wire through the opening, the first bond wire coupling the first and second bond pads with a first substrate bond pad on the back surface of the substrate.

16. The method of claim 14, further comprising:
attaching a third die to the front surface, wherein the third die includes an active side facing the front surface and a third bond pad aligned with the opening; and attaching a fourth die to the third die such that an edge of the fourth die extends past a corresponding edge of the third die, wherein the fourth die includes an active side facing the front surface and a fourth bond pad uncovered by the third die and aligned with the opening.

17. The method of claim 16, further comprising:
forming a bond wire through the opening, the bond wire configured to connect a first substrate bond pad on the back surface of the substrate, the first, second, third, and fourth bond pads, and a second substrate bond pad on the back surface of the substrate in series.

18. The method of claim 16, further comprising:
forming a first bond wire through the opening, the first bond wire coupling the first and second bond pads with a first substrate bond pad on the back surface of the substrate; and forming a second bond wire through the opening, the second bond wire coupling the third and fourth bond pads with a second substrate bond pad on the back surface of the substrate.

19. The method of claim 18, further comprising:
forming a third bond wire coupling the second bond pad of the second die with the fourth bond pad of the fourth die.

20. The method of claim 19, further comprising:
forming a first molding on the front surface of the substrate, the first molding encapsulating the first, second, third, and fourth dies; and forming a second molding on the back surface of the substrate, the second molding extending into the opening and encapsulating the first, second, and third bond wires.

* * * * *